(12) United States Patent
Wu et al.

(10) Patent No.: US 10,908,972 B2
(45) Date of Patent: Feb. 2, 2021

(54) METHODS, SYSTEMS, AND DEVICES FOR ACCURATE SIGNAL TIMING OF POWER COMPONENT EVENTS

(71) Applicants: Kesheng Wu, Palo Alto, CA (US);
Alex Sim, San Ramon, CA (US);
Jonathan Wang, Fremont, CA (US);
Seongwook Hwangbo, Yongin-si (KR)

(72) Inventors: Kesheng Wu, Palo Alto, CA (US);
Alex Sim, San Ramon, CA (US);
Jonathan Wang, Fremont, CA (US);
Seongwook Hwangbo, Yongin-si (KR)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 155 days.

(21) Appl. No.: 16/182,519

(22) Filed: Nov. 6, 2018

(65) Prior Publication Data

US 2019/0138371 A1    May 9, 2019

Related U.S. Application Data

(60) Provisional application No. 62/582,914, filed on Nov. 7, 2017.

(51) Int. Cl.
*G06F 9/54* (2006.01)
*G05B 23/02* (2006.01)
*G06F 30/23* (2020.01)

(52) U.S. Cl.
CPC ......... *G06F 9/542* (2013.01); *G05B 23/0221* (2013.01); *G05B 23/0254* (2013.01);
(Continued)

(58) Field of Classification Search
CPC .... G01R 31/62; G01R 31/12; G01R 31/1227; G01R 31/1209; G01R 31/1272;
(Continued)

(56) References Cited

U.S. PATENT DOCUMENTS 5,272,439 A * 12/1993 Mashikian ......... G01R 31/1272
324/520
2012/0123618 A1 * 5/2012 Kinser .................... B60L 50/16
701/22

(Continued)

FOREIGN PATENT DOCUMENTS

WO    WO 9724742 A1 *  7/1997  ............. G01R 31/06

*Primary Examiner* — Son T Le
(74) *Attorney, Agent, or Firm* — Kwan & Olynick LLP

(57) ABSTRACT

Disclosed herein are methods, systems, and devices for system event detection associated with power grid components. Methods include detecting, at a plurality of sensors, emissions from a system event associated with at least one winding of a power component. Methods also include determining, using a processor, a plurality of event parameters based, at least in part, on measurements made by the plurality of sensors, the event parameters identifying arrival times of the emissions at each of the plurality of sensors. Methods further include generating, using the processor, an output identifying an estimate of a position of the system event within the power component, the estimate being generated based, at least in part, on the arrival times identified by the plurality of event parameters.

20 Claims, 6 Drawing Sheets

(52) U.S. Cl.
CPC .......... *G06F 30/23* (2020.01); *G05B 23/0267* (2013.01); *G05B 2219/25353* (2013.01)

(58) Field of Classification Search
CPC . G01R 31/72; G06F 9/54; G06F 9/542; G06F 30/23; G05B 23/02; G05B 23/0221; G05B 23/0254; G05B 2219/25353; G05B 23/0267

See application file for complete search history.

(56) References Cited

U.S. PATENT DOCUMENTS

| | | | |
|---|---|---|---|
| 2015/0091598 A1* | 4/2015 | Han | G01R 31/1227 324/754.25 |
| 2015/0120218 A1* | 4/2015 | Garnacho Vecino | G01R 31/1263 702/58 |

* cited by examiner

METHODS, SYSTEMS, AND DEVICES FOR ACCURATE SIGNAL TIMING OF POWER COMPONENT EVENTS

CROSS-REFERENCE TO RELATED APPLICATIONS

This application claims the benefit under 35 U.S.C. § 119(e) of US Provisional Patent Application No. 62/582,914, filed on Nov. 7, 2017, which is incorporated herein by reference in its entirety for all purposes.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to power grid components, and more particularly to system event detection associated with power grid components.

BACKGROUND

Power grids use various power components, such as power transformers, to distribute power, and provide interfaces between different portions of power grids. Such power transformers include components configured to transfer electrical energy between two or more circuits or portions of such power grids. System events may occur within such components which may affect the operation of such power components. More specifically, a system event may be a failure event, or one or more other events that may be related to, or indicative of a future failure event. For example, as a power transformer ages, events, such as partial discharges, may occur. Such partial discharges may be internal arcing events indicative of degradation of transformer insulation.

SUMMARY

Disclosed herein are methods, systems, and devices for system event detection associated with power grid components. Methods include detecting, at a plurality of sensors, emissions from a system event associated with at least one winding of a power component. Methods also include determining, using a processor, a plurality of event parameters based, at least in part, on measurements made by the plurality of sensors, the event parameters identifying arrival times of the emissions at each of the plurality of sensors. Methods further include generating, using the processor, an output identifying an estimate of a position of the system event within the power component, the estimate being generated based, at least in part, on the arrival times identified by the plurality of event parameters.

In some embodiments, the system event is a partial discharge event. According to some embodiments, the plurality of sensors includes ultra-high frequency sensors configured to detect high frequency electromagnetic waves. In various embodiments, the plurality of sensors includes four sensors positioned within the power component. In some embodiments, the determining of the event parameters further includes defining an arrival window for each of the plurality of sensors, and reducing measurement noise in a portion of the measurements made during the arrival window. According to some embodiments, the measurement noise is reduced based on a Savitzky-Golay filter. In various embodiments, the estimate identifies three-dimensional coordinates characterizing a position of the system event within the power component. In various embodiments, methods further include detecting, at the plurality of sensors, emissions from an additional system event, and generating, using the processor, an output identifying an estimate of a position of the additional system event within the power component. In some embodiments, the system event and the additional system event are included in a cluster of system events. According to some embodiments, the cluster of system events identifies a failure of the power component.

Also disclosed herein are systems that may include a first conductive winding configured to conduct a first current, a second conductive winding configured to conduct a second current, and a plurality of sensors configured to detect emissions from a system event associated with the first conductive winding or the second conductive winding. The systems also include a processing device configured to determine a plurality of event parameters based, at least in part, on measurements made by the plurality of sensors, the event parameters identifying arrival times of the emissions at each of the plurality of sensors. The processing device is further configured to generate an output identifying an estimate of a position of the system event within the power component, the estimate being generated based, at least in part, on the arrival times identified by the plurality of event parameters.

In some embodiments, the system event is a partial discharge event associated with the first conductive winding or the second conductive winding. According to some embodiments, the plurality of sensors includes ultra-high frequency sensors configured to detect high frequency electromagnetic waves. In various embodiments, the processor is further configured to define an arrival window for each of the plurality of sensors, and reduce measurement noise in a portion of the measurements made during the arrival window. In some embodiments, the measurement noise is reduced based on a Savitzky-Golay filter. According to some embodiments, the sensors are further configured to detect emissions from an additional system event, and the processor is further configured to generate an output identifying an estimate of a position of the additional system event within the power component.

Further disclosed herein are devices that include an observation device configured to receive measurement signals from a plurality of sensors included in a power component, the plurality of sensors being configured to detect emissions from a system event associated with the power component. The devices may further include a processing device including one or more processors configured to determine a plurality of event parameters based, at least in part, on measurements made by the plurality of sensors, the event parameters identifying arrival times of the emissions at each of the plurality of sensors. The one or more processors may be further configured to generate an output identifying an estimate of a position of the system event within the power component, the estimate being generated based, at least in part, on the arrival times identified by the plurality of event parameters.

In some embodiments, the observation device is an oscilloscope. According to some embodiments, the system event is a partial discharge event associated with a first conductive winding or a second conductive winding of the power component. In various embodiments, the processor is further configured to define an arrival window for each of the plurality of sensors, and reduce measurement noise in a portion of the measurements made during the arrival window.

Details of one or more embodiments of the subject matter described in this specification are set forth in the accompanying drawings and the description below. Other features, aspects, and advantages will become apparent from the description, the drawings, and the claims.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

Figure 1:
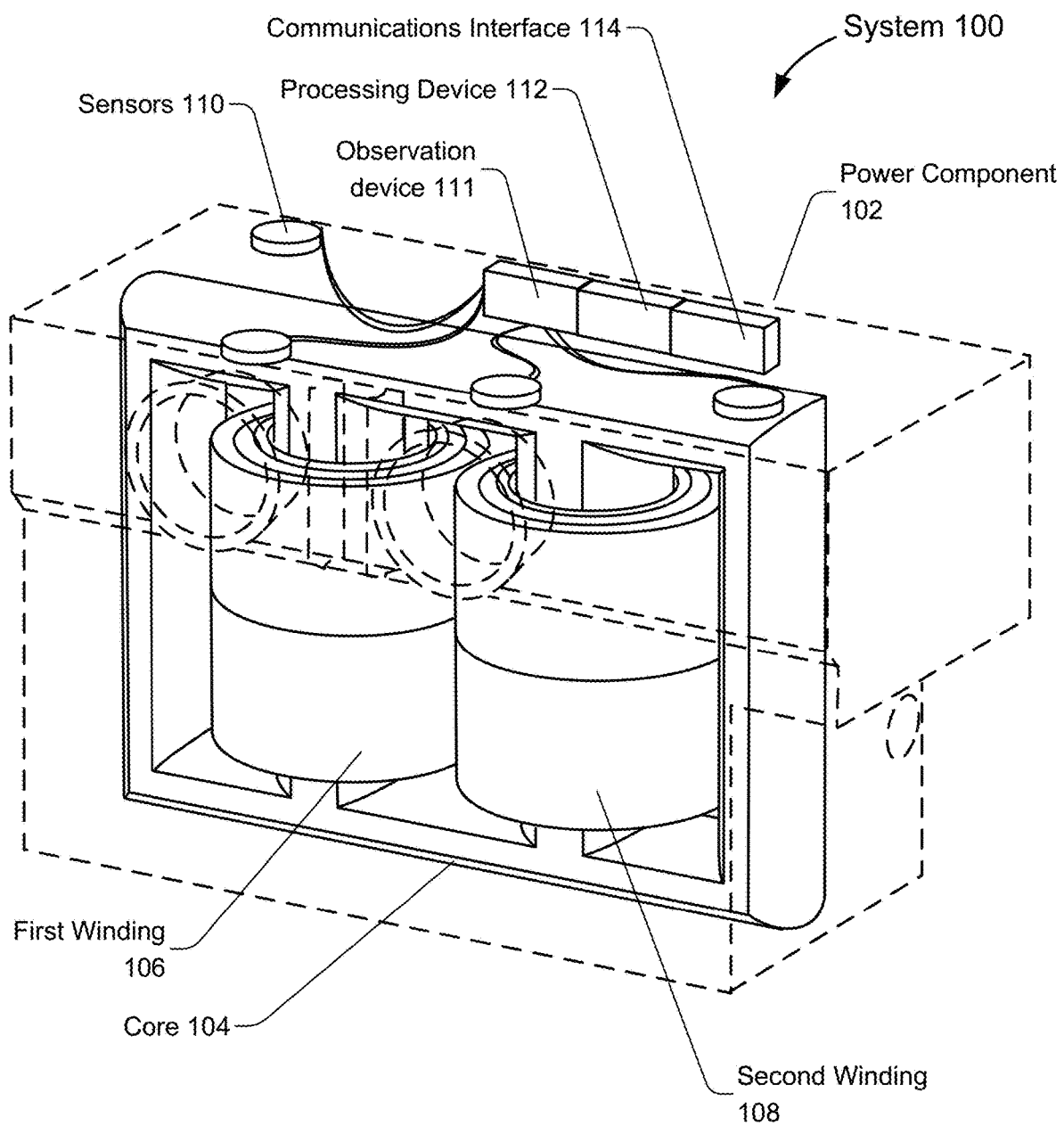
FIG. 1 illustrates an example of a system for power grid component event detection, configured in accordance with some embodiments.

FIG. 1 illustrates an example of a system for power grid component event detection, configured in accordance with some embodiments. As will be discussed in greater detail below, power grids may implement the use of various power components, such as power transformers. Such power transformers may include components configured to transfer electrical energy between two or more circuits or portions of power grids. As will also be discussed in greater detail below, system events may occur within such components which may affect the operation of such power components. More specifically, a system event may be a failure event, or one or more other events that may be related to, or indicative of a future failure event. For example, as a power transformer ages, events, such as partial discharges, may occur. Such partial discharges may be internal arcing events indicative of degradation of transformer insulation. Moreover, such partial discharges may predict the future occurrence of a larger failure and internal short circuit. Accordingly, various components of system 100 are configured to detect such system events, and are further configured to identify locations of such system events to facilitate the maintenance and repair of such components.

In various embodiments, system 100 includes power component 102. As discussed above, power component 102 is a component of a power grid, and in one example, is a power transformer. Accordingly, power component 102 is configured to transfer electrical energy between two portions of an electrical grid, and may include various components to implement such transfer, as will be discussed in greater detail below.

For example, power component 102 includes core 104 and various windings, such as first winding 106 and second winding 108. In various embodiments, core 104 is made of a conductive material, such as steel, or any other suitable conductive material. The windings may include concentric loops of a conductive wire. The configuration of the windings may be determined based on the characteristics of power component 102, and a desired transfer characteristic between a first circuit and a second circuit coupled to power component 102. In various embodiments, power component 102 may be filled with an insulator, such as transformer oil, which may be used to insulate the windings from each other.

Power component 102 further includes sensors 110 which are configured to detect system events. In one example, sensors 110 are ultra-high frequency (UHF) sensors that are configured to detect electromagnetic (EM) waves of varying frequencies. Accordingly, sensors 110 are placed within power component 102, and are configured to detect EM waves within power component 102. As will be discussed in greater detail below, such EM waves may be generated by, among other things, the previously discussed system events, such as partial discharge events. Accordingly, such EM waves may be generated, and may take one of various different paths, as discussed in greater detail below with reference to FIG. 2, before arriving at one or more of sensors 110, and being detected by sensors 110. As will also be discussed in greater detail below, other components of power component 102 may also generate EM waves which may also be detected by sensors 110 as signal noise.

In various embodiments, sensors 110 may include four sensors. However, in some embodiments, sensors 110 may include additional sensors, such as a total of six sensors which may provide additional accuracy in partial discharge event localization. Accordingly, while FIG. 1 illustrates the use of four sensors, various different configurations utilizing different numbers of sensors are contemplated and disclosed herein.

Power component 102 further includes observation device 111. In various embodiments, observation device 111 is a measurement device, such as an oscilloscope, that is configured to receive measurement signals from sensors 110 and convert the measurement signals into signal files that may be utilized by a processing device or data processing system, such as processing device 112 discussed in greater detail below. Accordingly, observation device 111 is communicatively coupled to sensors 110, is configured to monitor and receive measurements acquired by sensors 110, and is configured to generate an output that is provided to processing device 112, where the output characterizes the measurements made by sensors 110.

Accordingly, power component 102 also includes processing device 112 which is configured to generate temporal and positional parameters associated with system events. In various embodiments, processing device 112 is communicatively coupled to observation device 111, and is configured to generate the temporal and positional parameters based on the measurements made by sensors 110, and represented in the output provided by observation device 111. In various embodiments, processing device 112 includes one or more components, such as a processor and memory, configured to implement such generation of the temporal and positional parameters. Further details of the components of processing device 112 are discussed in greater detail below with reference to FIG. 6.

Furthermore, it will be appreciated that while observation device 111 and processing device 112 are shown as included in power component 102, observation device 111 and processing device 112 may be implemented externally from power component 102. In one example, observation device 111 is implemented as an oscilloscope that is located outside of a housing of power component 102, and processing device 112 is implemented as a data processing system that is also outside of power component 102. In some embodiments, observation device 111 and processing device 112 may be implemented in an adjacent structure such as a monitoring facility.

As will be discussed in greater detail below, processing device 112 is configured to identify arrival times as which a system event was detected at each of sensors 110, and is further configured to utilize those identified times in conjunction with a finite-difference time-domain (FDTD) simulation to identify a location of the originating system event. In this way, a partial discharge event may generate EM waves detected by sensors 110, and the signals generated by sensors 110 may be utilized to determine a location within power component 102 of the partial discharge event. Additional details of the determination of the location of system events are discussed in greater detail below with reference to FIG. 3, FIG. 4, and FIG. 5.

Power component 102 further includes communications interface 114. In various embodiments, communications interface 114 is coupled to processing device 112 and is configured to provide communicative coupling to one or more other components via one or more communications networks. In one example, communications interface 114 is configured to provide a network connection to the internet, and is configured to be communicatively coupled with another computer system or computing device. In this example, processing device 112 is configured to generate an output identifying an occurrence and location of a system event, and such output may be included in message sent to the computer system via communications interface 114. In this way, processing device 112 is able to provide one or more notifications to another entity, such as an administrator or power grid monitor, that identifies the occurrence of a system event as well as various information, such as a location, associated with the system event. In various embodiments, the message further includes various other identifiers, such as a unique identifier that identifies power component 102, as well as other information, such as a timestamp associated with the system event.

In some embodiments, power component 102 includes one or more power couplers that are configured to couple the windings of power component 102 with other portions of electrical grids. For example, power couplers may include a first power coupler that is coupled to first winding 106 via one or more cables or wires, and is configured to couple first winding 106 with a first circuit. The power couplers may also include a second power coupler that is coupled to second winding 108 via one or more cables or wires, and is configured to couple second winding 108 with a second circuit, where the first and second circuits are different circuits in an electrical grid. In this way, internal components of power component 102 may be coupled with components of power grids to effectively transfer electrical energy within the power grids. For the purposes of clarity of the depiction of other components of system 100, the power couplers have not been shown in FIG. 1.

Figure 2:
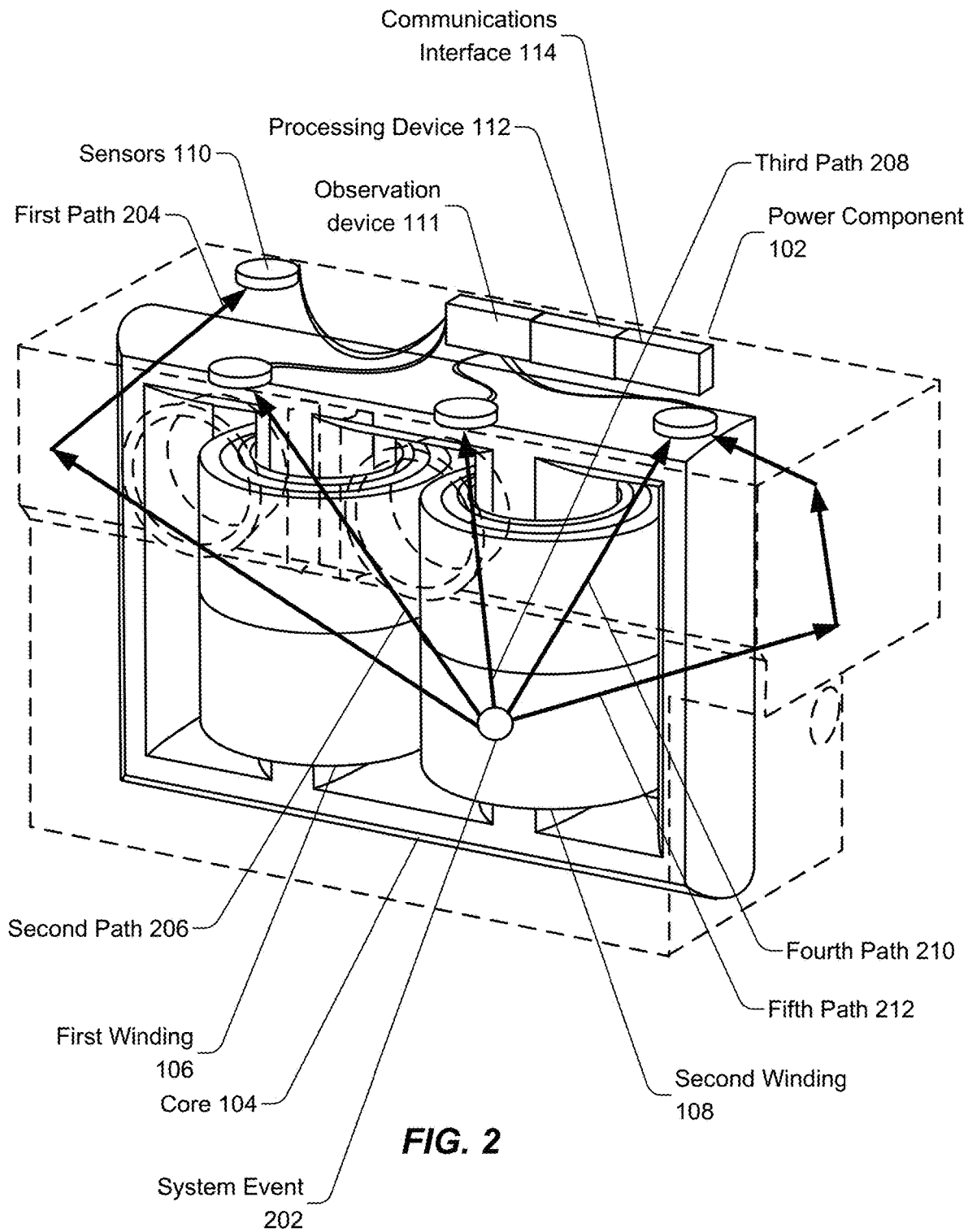
FIG. 2 illustrates another example of a system for power grid component event detection, configured in accordance with some embodiments.

FIG. 2 illustrates another example of a system for power grid component event detection, configured in accordance with some embodiments. As discussed above, system 100 includes power component 102 which may include core 104, first winding 106, second winding 108, sensors 110, processing device 112, communications interface 114, and may also include one or more power couplers. As also discussed above, system events, which may be partial discharge events, may occur within power component 102. Such partial discharge events may be arcing events in which electrical energy arcs across different loops of a winding. Typically, insulation is implemented to prevent such arcing. However, degradation of the insulation may result in such partial discharge events, and indicate that some maintenance should be implemented.

As shown in FIG. 2, a system event, such as system event 202, may emit EM waves that travel in a variety of directions and take numerous different paths before arriving at sensors 110. For example, EM waves may take first path 204, second path 206, third path 208, and fourth path 210 to get to different sensors of sensors 110. Furthermore, the EM waves may also take additional paths, such as fifth path 212, to arrive at a sensor an additional time, such as after the arrival of the EM wave that took first path 204.

Accordingly, as shown in FIG. 2, a single system event may generate EM waves that propagate along a variety of different pathways, some of which may be direct and involve no reflections, and some of which may be fairly indirect and involve one or more reflections. Such variations in pathways taken may result in particular timing characteristics of the arrival of EM waves at different sensors, as well as a number of EM waves arriving at a particular sensor at different times.

Figure 3:
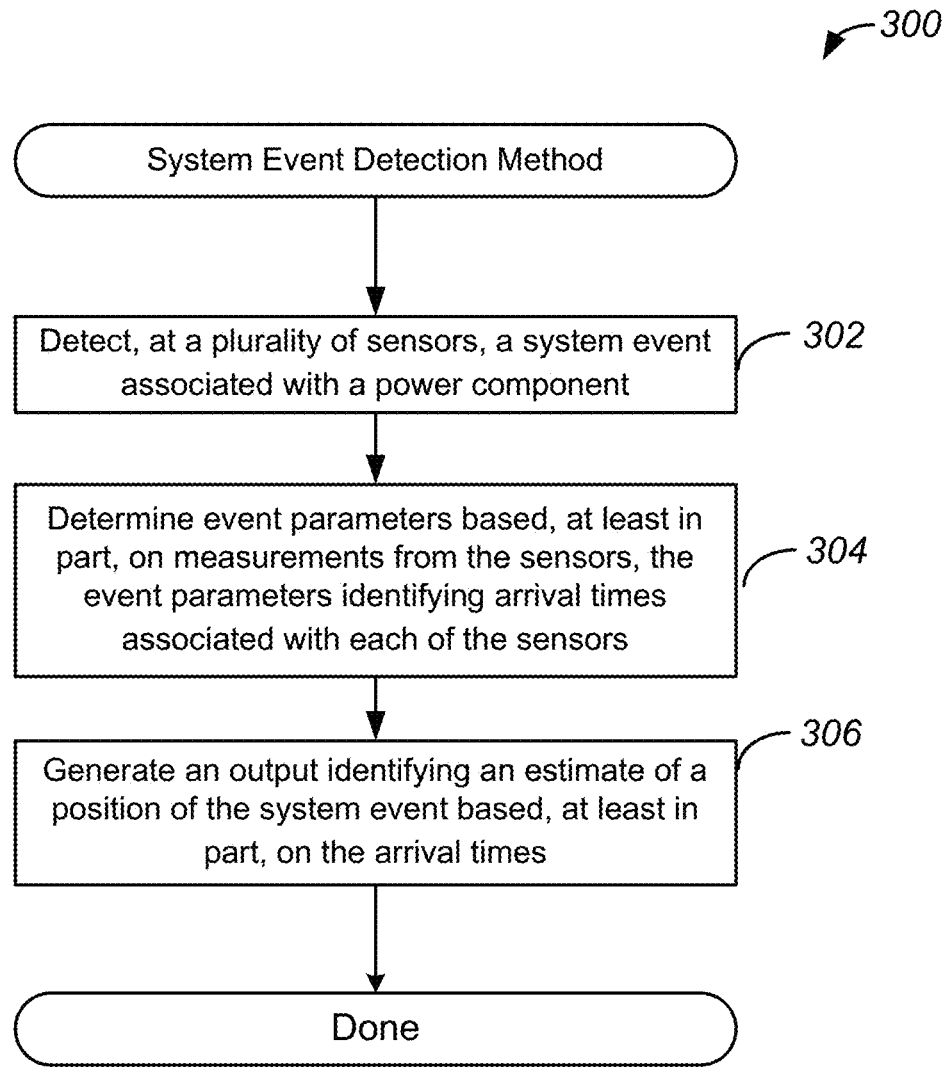
FIG. 3 illustrates flow chart of an example of a system event detection method, implemented in accordance with some embodiments.

FIG. 3 illustrates flow chart of an example of system event detection method, implemented in accordance with some embodiments. As previously discussed, a system event, such as a partial discharge event, may occur in a power component. As will be discussed in greater detail below, the system event may emit EM radiation that is detectable at sensors installed within the power component. Furthermore, the timing of the signals received at the sensors may be used to estimate a position of the originating system event. More specifically, differences and/or characteristics of the timing of the detected signals may be used to estimate the location of the system event. In various embodiments, the sensors and processing device of the power component are configured to identify a timing of the detection of the EM radiation at the sensors with increased accuracy thus enabling estimation of the position of the system event with increased accuracy.

Method 300 may commence with operation 302 during which system event may be detected by sensors. As discussed above, the system event may be related to a partial discharge event that occurs within the power component. Accordingly, emissions from the partial discharge event may take one or more paths, and arrive at one or more sensors, and be detected. As will be discussed in greater detail below, the sensors and the processing device are configured to precisely identify a time at which the emissions from the system event arrive at the sensors. Such precise timing of the signal enables more precise localization of the system event, as will be discussed in greater detail below.

Method 300 may proceed to operation 304 during which event parameters may be determined. In various embodiments, the event parameters characterize aspects of the system event that are used to identify the originating system event's position. For example, event parameters may include an identified time window over which the system event is detected at the various sensors. The event parameters may further include one or more identifiers that identify sensors at which signals were received, as well as an indication of a time at which each signal was received at each sensor. As will be discussed in greater detail below, such parameters may be generated and used subsequently for system event localization.

Method 300 may proceed to operation 306 during which an output identifying a position may be generated. In various embodiments, the output identifies an estimated position or location of the originating system event. Accordingly, the previously described event parameters may be provided to a FDTD-based model, and an output may be generated that identifies an estimate of three dimensional coordinates that identify the location of system event. In this way, the signals received at the sensors may be detected with increased temporal accuracy, and used to generate an estimate of the location of a detected system event that has an increased positional accuracy.

Figure 4:
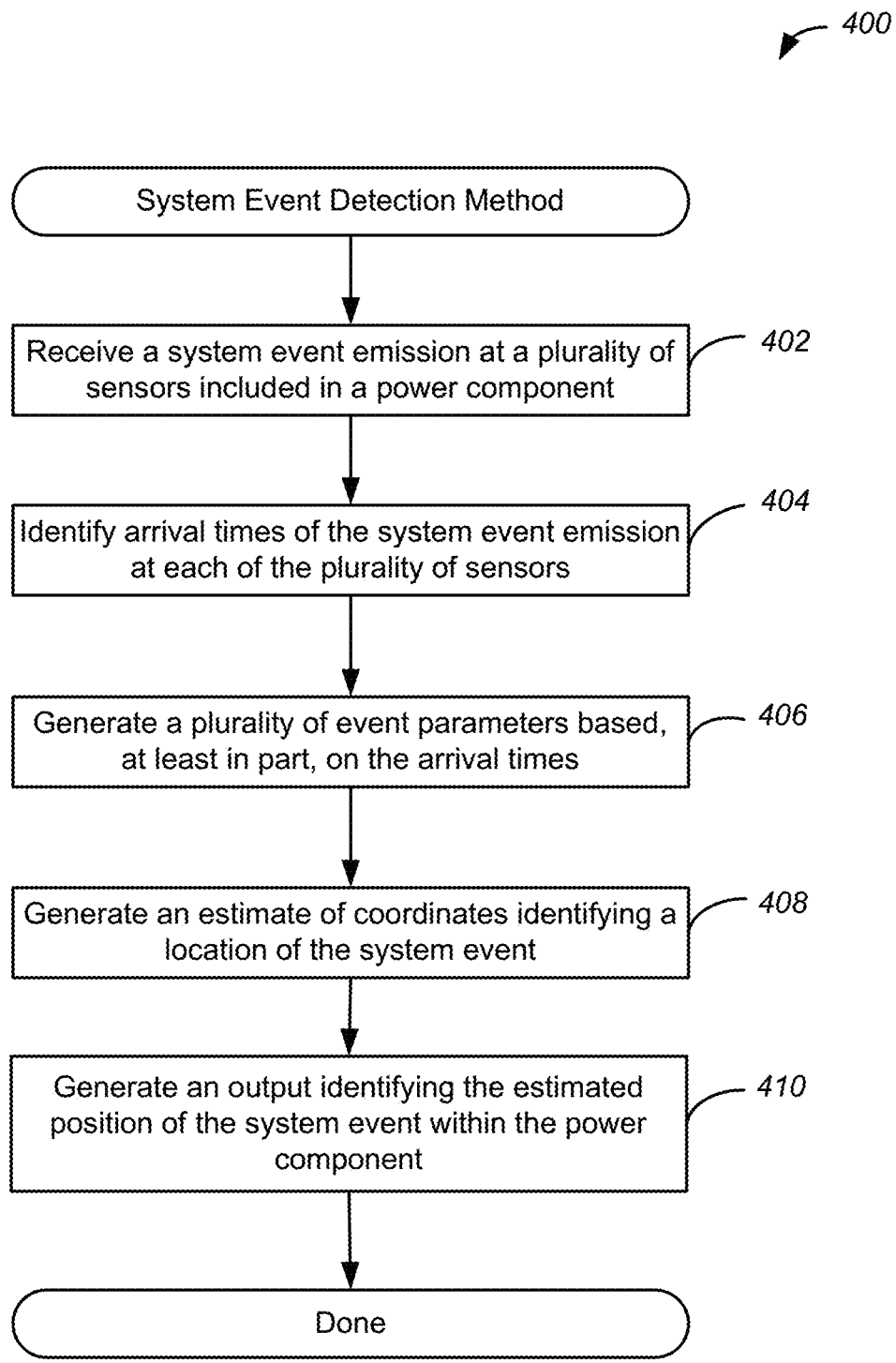
FIG. 4 illustrates a flow chart of an example of another system event detection method, implemented in accordance with some embodiments.

FIG. 4 illustrates a flow chart of an example of another system event detection method, implemented in accordance with some embodiments. As discussed above, system events may be partial discharge events indicative of imminent component failures of a power component, such as a power transformer. As will be discussed in greater detail below, the internal components of power transformers, as well as the operation of such components, generates noise that results in lower signal-to-noise ratios of measurements made by sensors included in the power transformer. As discussed above, when the measurements made by such sensors have a low signal-to-noise ratio, precise timing of arrival of EM waves from partial discharge events is difficult, as is accurate estimation of partial discharge event location based on such arrival times. As will be discussed in greater detail below, sensors and processing devices as disclosed herein are configured to identify arrival times of such EM waves with increased accuracy despite the presence of such signals noise, thus resulting in increased accuracy of location estimation.

Method 400 may commence with operation 402 during which a system event emission may be may be received by sensors. As similarly discussed above, the system event may be related to a partial discharge event that occurs within the power component, and emissions from the partial discharge event may take one or more paths, arrive at one or more sensors, and are detected. In some embodiments, the sensors are configured to monitor and record detected signals at a very high frequency. In one example, measurements may be made and acquired in temporal increments of less than a half of a nanosecond. In some embodiments, the measurements made are voltage measurements of the signals generated by the sensors.

In various embodiments, the sensors may also inadvertently detect other signals generated during the operation of the power component. Accordingly, the measurements made by the sensors experience signal noise resulting from background and ambient conditions within the power component. In some embodiments, such a low signal-to-noise ratio may also result from a sensor being further away from a system event, and being blocked by internal structures of the power component which result in an indirect path, as discussed above with reference to FIG. 2. As will be discussed in greater detail below, the signals acquired at the sensors may be modified to compensate for such signal noise, and enable the precise identification of arrival times associated with the detected signals.

Method 400 may proceed to operation 404 during which arrival times of the inputs may be identified. As discussed above, each sensor may generate a time series of acquired measurements that may detect the occurrence of a system event as well as the occurrence of some signal noise. As will be discussed in greater detail below, the measurements made by the sensors may be modified to enable the precise identification of the time at which a signal from a system event arrives at each sensor.

As discussed above, signal noise may obscure the time at which a signal arrives at a particular sensor. In some embodiments, processing device is configured to identify an arrival window for each sensor. The arrival window defines a temporal window in which the signal emitted from the system event has arrived at the sensor. Thus, according to some embodiments, the processing device is configured to implement a smoothing technique to smooth the measurement data. Such a smoothing technique may include the application of a Savitzky-Golay filter that improves the signal-to-noise ratio of the acquired measurement data. More specifically, the Savitzky-Golay filter is configured to fit windows of the signal to a low degree polynomial by using a least squares technique. The solutions of the least squares equations are applied to the measurement windows to generate an estimate of a smoothed signal. In various embodiments, other techniques for determining arrival times are also implemented. For example, cumulative energy and energy criterion techniques may be implemented.

A threshold may be utilized and applied to the smoothed measurement data to identify the arrival window. In various embodiments, the threshold is determined based on a mean and standard deviation of the received measurement data that has not undergone smoothing. Accordingly, the arrival window may be a first half of a measurement window. In various embodiments, an initial window is defined as a configurable or predetermined parameter. For example, an origin in filtered measurement data may be determined based on a standard deviation threshold of noise (which may be a specified or designated parameter). A range of points before and after the origin may be selected as two additional parameters. A final measurement window may be a moving average of the initial window. In some embodiments, a size of the windows is also a configurable parameter.

In various embodiments, a moving average refinement may be implemented to further remove signal noise. For example, the data that has already been smoothed by, for example, the above-described application of a Savitzky-Golay filter, may also be subjected to a moving average that is applied across the measurement data. In various embodiments, the implementation of a moving average takes a set of points and a moving window size parameter for the number of points before and points after the origin, as similarly discussed above. For each point $w\_i$, an average of p points may be taken before $w\_i$ and q points after as the value for $m\_i$, where m is the moving average window.

In some embodiments, arrival times may be identified based on the above-described smoothed and refined measurement data. For example, the initial time window may include an identifiable peak, and such peak may be used to identify an arrival time of a signal at that particular sensor. In various embodiments, the initial window contains one significant peak when window size parameters have been configured as described above. In some embodiments, the start of a peak may be identified based on a designated threshold. In some embodiments, the peak may be identified by finding a local maximum. In such embodiments, a backshift based on frequency may be implemented to account for inconsistent width of peaks across sensors.

In this way, the noise experienced by the sensors may be mitigated to increase the signal-to-noise ratio of the measurements made by the sensors, and increase the accuracy of the identification of the arrival time for each sensor. As will be discussed in greater detail below, because subsequent determination of localization is dependent on such determined arrival times, the increased accuracy of the identification of such arrival times results in an increased accuracy of the identification of positions of system events.

Method 400 may proceed to operation 406 during which event parameters may be determined based on the arrival times. In various embodiments, the event parameters are parameters that are used to generate an estimate of a position of a system event, as will be discussed in greater detail below. For example, the event parameters may include identifiers that identify each sensor from which a signal has been measured. Moreover, the event parameters may further identify an arrival time for each signal of each sensor. The arrival time may be represented in any suitable manner. For example, the arrival time may be a timestamp, or may be an amount of time from a reference point, such as a beginning of an initial window. As will be discussed in greater detail below, implementations of FDTD-based simulations may utilize arrival times at each sensor from each index point. For example, if there are four sensors, there may be four values for each index point.

Method 400 may proceed to operation 408 during which an estimate of coordinates identifying a location of the system event may be generated. In various embodiments, the arrival times of the sensors, as well as designated positional data of the sensors, may be utilized by the processing device to generate an estimate of the location of the system event. In some embodiments, known locations of the sensors may have been previously determined, as may have been specified during construction and setup of the power component. In various embodiments, estimates of the position of the system event may be generated utilizing a series of quadratic equations. In one example, a series of four quadratic equations may be generated based on equations 1 and 2 shown below associated with each of four sensors, in one example. The equations may be solved to determine the coordinates of the system event. In equations 1 and 2, x, y, and z are the coordinates of the system event, t is the time the signal originates. Moreover, $c_e$ is the effective speed of light (c) traveling through a medium, such as oil, in the power component. Furthermore, in an example with four sensors, for i=1, 2, 3, 4, the variables $x_i$, $y_i$, and $z_i$ represent the coordinates of the sensors, and $t_i$ is the time that a signal reaches a particular sensor as identified by the index i.

$$(x-x_i)^2+(y-y_i)^2(z-z_i)^2-(c_e(t-t_i))^2=0 \quad (1)$$

$$c_e=c/\sqrt{1.7} \quad (2)$$

In another example, estimates of the position of the system event may be generated utilizing FDTD-based simulations. Accordingly, known positions of the sensors as well as other dimensions of the power component may have been used to generate a reference table. More specifically, the FDTD simulations may be specifically configured to simulate the transmission of EM waves from system events within various locations of the power component, and simulated travel times of EM waves emitted from system events may be generated for each location, and stored in a reference table. In various embodiments, the FDTD simulations may be generated based on an available simulation software application, which may simulate the transmission of EM waves through various media. Such simulation software applications may be any suitable and available finite-difference time-domain package, or may be specifically configured as a three-dimensional electromagnetic simulation software application.

As discussed above, the FDTD simulation software package or application may be used to generate a reference table based on parameters and a configuration of the power component, and such a reference table may include various entries mapping a location of an event to detection times at each respective sensor, as determined by the simulation. When such detection of events occurs during operation of the power component, the reference table may be used to map the detection times to a location. In this way, the reference table may have been generated specifically for the power component in which the sensors are situated. As discussed above, during operation, measurements may be made to identify arrival times of a signal from a system event at each sensor. The reference table is used to look up a particular estimated location based on the determined arrival times. In various embodiments, time differences may be computed for the purposes of FDTD lookup. The computed time differences may be computed and utilized because input or start times might not be based on the same start time as the lookup table. For example, if there are four sensors, three time differences may be computed using one time as the base time and all other times being relative to that time.

Method 400 may proceed to operation 410 during which an output identifying the estimated position may be generated. In various embodiments, the output may be a file or a message. For example, the output may be a storage file or a data record that is stored in a memory of the processing device. In another example, the output may be a message that is configured to be transmitted via a communications network. Accordingly, the estimate of the coordinates may be included in a message and transmitted via a communications network to another entity, such as another component of a power grid, or a monitor of the power grid. In this way, the estimated coordinates of a system event, such as a partial discharge event, may be stored locally at the power component, as well as transmitted to another entity of the power grid. Such transmission notifies the other entity that such a system event has occurred, and enables the efficient implementation of maintenance and repair operations due to how quickly such notification may be provided, as well as the improved accuracy of the location information that is provided.

Figure 5:
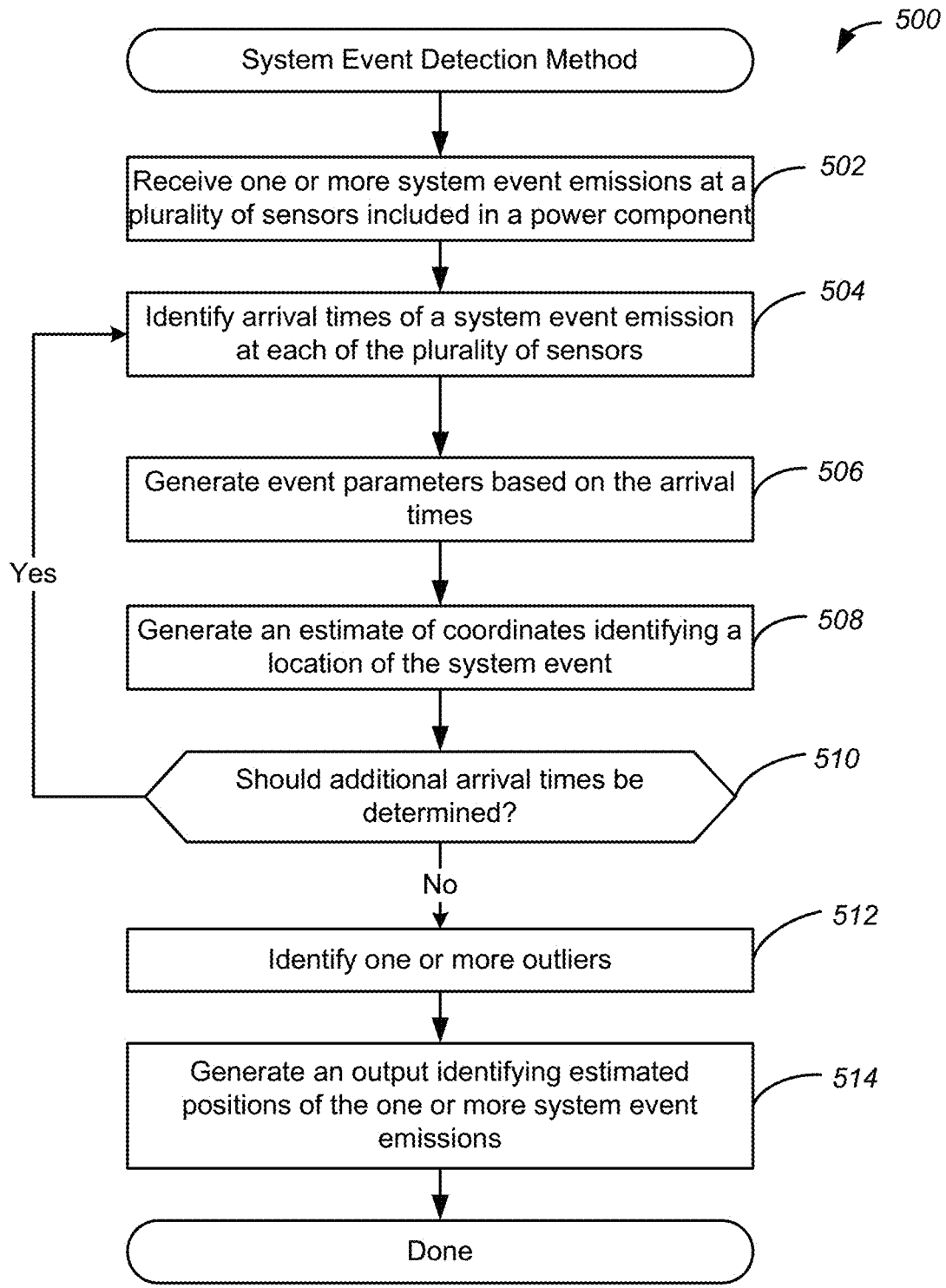
FIG. 5 illustrates a flow chart of an example of yet another system event detection method, implemented in accordance with some embodiments.

FIG. 5 illustrates a flow chart of an example of yet another system event detection method, implemented in accordance with some embodiments. As discussed above, system events may be partial discharge events indicative of imminent component failures of a power component, such as a power transformer. As will be discussed in greater detail below, partial discharge events may occur in clusters. More specifically, a particular component failure may incur multiple partial discharge events that may be represented as a cluster of events related to a particular failure. As will be discussed below, various embodiments disclosed herein identify clusters of such events as well as locations of the events within each cluster.

Method 500 may commence with operation 502 during which one or more system event emissions may be may be received by sensors. As discussed above, system events may be partial discharge events that occur within the power component, and emissions from the partial discharge events may take one or more paths, arrive at one or more sensors, and be detected. As also discussed above, the sensors are configured to make measurements that are voltage measurements. In various embodiments, during a period of time, there may be several system events. For example, multiple partial discharge events may occur over a period of time and result in multiple partial discharge events being detected by the sensors.

Method 500 may proceed to operation 504 during which arrival times may be identified. As discussed above, each sensor may generate a time series of acquired measurements that may detect the occurrence of a system event as well as the occurrence of some signal noise. As also discussed above, the measurements made by the sensors may be modified to enable the precise identification of the time at which a signal from a system event arrives at each sensor.

Method 500 may proceed to operation 506 during which event parameters may be determined based on the arrival times. As also discussed above, the event parameters are parameters that are used to generate an estimate of a position of a system event. In some embodiments, the event parameters include identifiers that identify each sensor from which a signal has been measured, and further identify an arrival time for each signal at each sensor. As discussed above, the arrival time may be represented in any suitable manner. For example, the arrival time may be a timestamp, or may be an amount of time from a reference point, such as a beginning of an initial window.

Method 500 may proceed to operation 508 during which an estimate of coordinates identifying a location of the system event may be generated. As discussed above, such estimates of coordinates may be generated based on implementations of multilateration techniques, such as the use of systems of quadratic equations, or may be generated using FDTD-based simulation techniques. In this way, an estimate of a location of a detected system event may be generated and stored in a memory of a processing device.

Method 500 may proceed to operation 510 during which if may be determined if additional arrival times should be determined. In various embodiments, such a determination may be made based on whether or not additional time series data has been recorded, or based on whether or not a designated period of time has elapsed. More specifically, a processing device may be configured to identify arrival times within portions of a particular period of time, which may be predetermined. Accordingly, the processing device may be configured to view measurement data over a designated period of time which may be partitioned or divided into portions of time. The processing device may be further configured to identify arrival times associated with a system event within each portion of the period of time. In this way, the processing device may step through each portion of time to identify multiple partial discharges that may have occurred within the designated period of time. If it is determined that additional arrival times should be determined, method 500 may return to operation 504. If it is determined that no additional arrival times should not be determined, then method 500 may proceed to operation 510.

Method 500 may proceed to operation 512 during which one or more outliers may be identified. In various embodiments, the identified system event locations may be filtered to minimize or eliminate outliers. In this way, the identified system events may be adjusted or modified to generate identified clusters of system events that may characterize a series of related system events. For example, a cluster of partial discharge events may be detected and used to identify a serious system failure. In this way, system events may be clustered to identify particular types of failure events as well as a corresponding severity.

In various embodiments, outliers may be identified and removed from identified clusters to improve the accuracy of the identified clusters of system events. More specifically, the processing device is configured to label detected system events with a particular cluster identifier, and is further configured to estimate a center or a distance of the cluster. The processing device is further configured to apply a designated threshold to the system events of the cluster. For example, the processing device may remove from the cluster any identified system events that are farther from the identified center than a designated threshold distance. In this way, the identified system events may be filtered based on a distance from the center of the cluster. In one example, density-based spatial clustering of applications with noise (DBSCAN) may be utilized to label the system events of the cluster, identify the center of the cluster, and implement the filtering. Details of such DBSCAN techniques may be found in available resources such as "A Density Based Algorithm for Discovering Clusters" (Ester, Kriegel, Sander, Xu. KDD 96), which is incorporated herein by reference.

Method 500 may proceed to operation 514 during which an output identifying the estimated positions may be generated. In various embodiments, the output may be a file or a message. For example, the output may be a storage file or a data record that is stored in a memory of the processing device. In another example, the output may be a message that is configured to be transmitted via a communications network. Accordingly, the estimate of the coordinates may be included in a message and transmitted via a communications network to another entity, such as another component of a power grid, or a monitor of the power grid. In this way, the estimated coordinates of clusters of system events, such as multiple partial discharge events, may be stored locally at the power component, as well as transmitted to another entity of the power grid. As discussed above, such transmission notifies the other entity that such system events have occurred, and enables the efficient implementation of maintenance and repair operations due to how quickly such notification may be provided, as well as the improved accuracy of the location information that is provided.

It will be appreciated while the above has been described for a particular cluster, any number of clusters may be identified and included in the output. Accordingly, multiple clusters of system events may be identified and included in the generated output.

Figure 6:
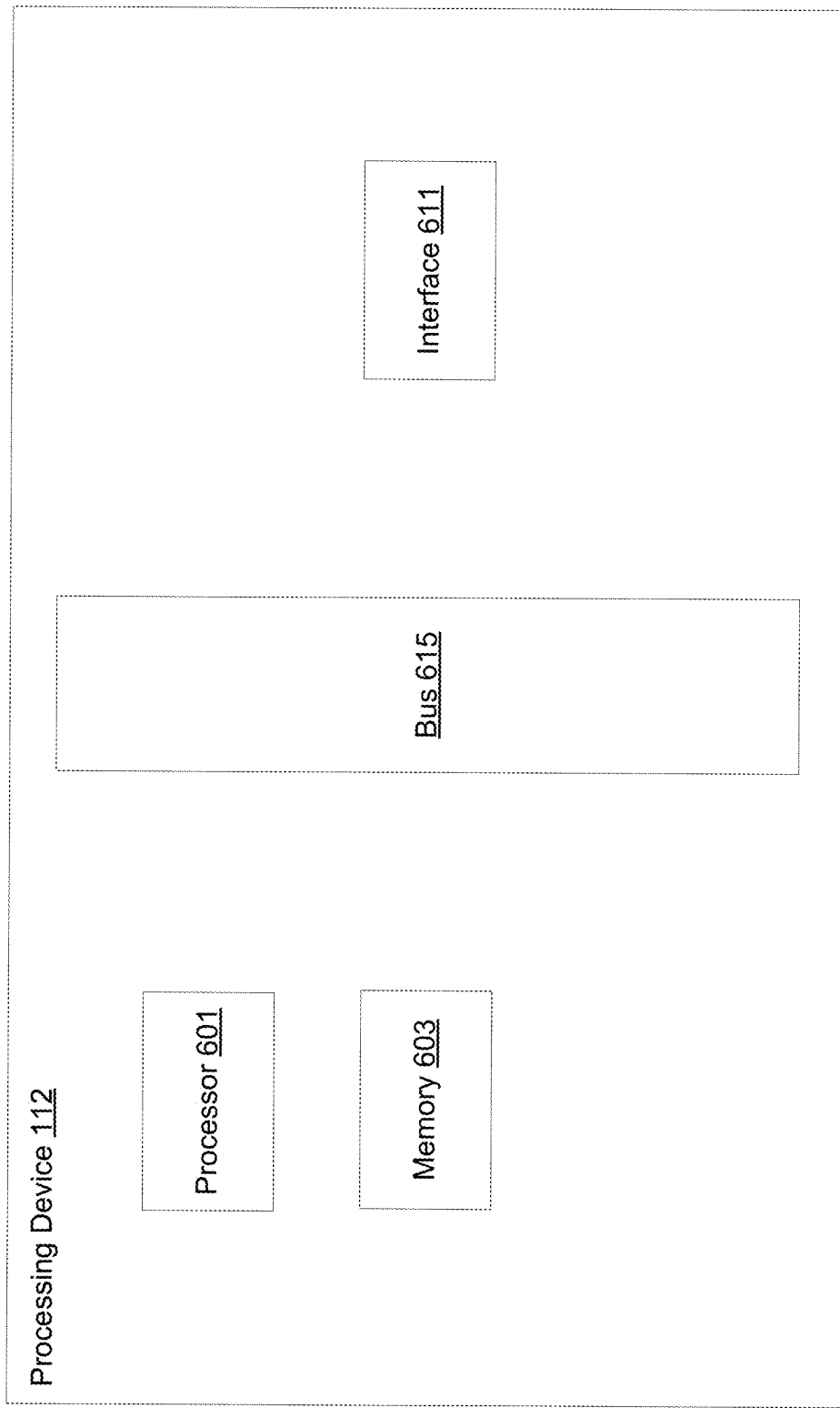
FIG. 6 illustrates one example of a processing device, configured in accordance with some embodiments.

FIG. 6 illustrates one example of a processing device, configured in accordance with some embodiments. According to particular embodiments, a processing device, such as processing device 112 discussed above, may include a processor 601, a memory 603, an interface 611, and a bus 615 (e.g., a PCI bus or other interconnection fabric) and operates as a processing device, such as processing device 112, configured to identify locations of system events, as discussed above. When acting under the control of appropriate software or firmware, the processor 601 is configured to identify arrival times and generate estimates of system event locations. As discussed above, processing device 112 may be implemented in system 100 discussed above, or may be implemented separately as a stand-alone component that provides functionalities for system 100. Various specially configured devices can also be used in place of a processor 601 or in addition to processor 601. The interface 611 is typically configured to send and receive data. In some embodiments, such an interface may be configured to send packets or data segments over a network.

Particular examples of interfaces supported include Ethernet interfaces, cable interfaces, DSL interfaces, token ring interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate system components. In some cases, they may also include an independent processor and, in some instances, volatile RAM. The independent processors may control communications-intensive tasks.

In some implementations, one or more of the processing device components may be virtualized. For example, a physical processor may be configured in a localized or cloud environment. Although a particular processing device is described, it should be recognized that a variety of alternative configurations are possible. Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatus. Accordingly, the present examples are to be considered as illustrative and not restrictive.

What is claimed is:

1. A method comprising:
   detecting, at a plurality of sensors, emissions from a system event associated with at least one winding of a power component;
   determining, using a processor, a plurality of event parameters based, at least in part, on measurements made by the plurality of sensors, the event parameters defining a plurality of temporal windows for the plurality of sensors, each of the plurality of temporal windows being a window of measurement data in which at least some of the emissions arrived at its associated sensor, and the event parameters identifying arrival times of the emissions at each of the plurality of sensors by reducing a measurement noise in each defined temporal window; and
   generating, using the processor, an output identifying an estimate of a position of the system event within the power component, the estimate being generated based, at least in part, on the arrival times identified by the plurality of event parameters.

2. The method of claim 1, wherein the system event is a partial discharge event.

3. The method of claim 1, wherein the plurality of sensors comprises ultra-high frequency sensors configured to detect high frequency electromagnetic waves.

4. The method of claim 3, wherein the plurality of sensors comprises four sensors positioned within the power component.

5. The method of claim 1 wherein the reducing of the measurement noise comprises:
   smoothing the measurement data included in each of the plurality of temporal windows.

6. The method of claim 5 wherein the measurement noise is reduced based on a Savitzky-Golay filter.

7. The method of claim 1 wherein the estimate identifies three-dimensional coordinates characterizing a position of the system event within the power component.

8. The method of claim 1 further comprising:
   detecting, at the plurality of sensors, emissions from an additional system event; and
   generating, using the processor, an output identifying an estimate of a position of the additional system event within the power component.

9. The method of claim 8, wherein the system event and the additional system event are included in a cluster of system events.

10. The method of claim 9, wherein the cluster of system events identifies a failure of the power component.

11. A system comprising:
    a first conductive winding configured to conduct a first current;
    a second conductive winding configured to conduct a second current;
    a plurality of sensors configured to detect emissions from a system event associated with the first conductive winding or the second conductive winding; and
    a processing device configured to:
      determine a plurality of event parameters based, at least in part, on measurements made by the plurality of sensors, the event parameters defining a plurality of temporal windows for the plurality of sensors, each of the plurality of temporal windows being a window of measurement data in which at least some of the emissions arrived at its associated sensor, and the event parameters identifying arrival times of the emissions at each of the plurality of sensors by reducing a measurement noise in each defined temporal window; and
      generate an output identifying an estimate of a position of the system event within a power component, the estimate being generated based, at least in part, on the arrival times identified by the plurality of event parameters.

12. The system of claim 11, wherein the system event is a partial discharge event associated with the first conductive winding or the second conductive winding.

13. The system of claim 11, wherein the plurality of sensors comprises ultra-high frequency sensors configured to detect high frequency electromagnetic waves.

14. The system of claim 11, wherein the reducing of the measurement noise comprises:
    smoothing the measurement data included in each of the plurality of temporal windows.

15. The system of claim 14, wherein the measurement noise is reduced based on a Savitzky-Golay filter.

16. The system of claim 11, wherein the sensors are further configured to:
    detect emissions from an additional system event, and
    wherein the processing device is further configured to:
      generate an output identifying an estimate of a position of the additional system event within the power component.

17. A device comprising:
    an observation device configured to receive measurement signals from a plurality of sensors included in a power component, the plurality of sensors being configured to detect emissions from a system event associated with the power component;
    processing device comprising one or more processors configured to:
      determine a plurality of event parameters based, at least in part, on measurements made by the plurality of sensors, the event parameters defining a plurality of temporal windows for the plurality of sensors, each of the plurality of temporal windows being a window of measurement data in which at least some of the emissions arrived at its associated sensor, and the event parameters identifying arrival times of the emissions at each of the plurality of sensors by reducing a measurement noise in each defined temporal window; and generate an output identifying an estimate of a position of the system event within the power component, the estimate being generated based, at least in part, on the arrival times identified by the plurality of event parameters.

18. The device of claim 17, wherein the observation device is an oscilloscope.

19. The device of claim 17, wherein the system event is a partial discharge event associated with a first conductive winding or a second conductive winding of the power component.

20. The device of claim 17, wherein the reducing of the measurement noise comprises:

smoothing the measurement data included in each of the plurality of temporal windows.

* * * * *